United States Patent
Kotera et al.

(10) Patent No.: US 12,466,927 B2
(45) Date of Patent: Nov. 11, 2025

(54) ROLL FILM, METHOD FOR PRODUCING ROLL FILM, METHOD FOR PRODUCING COPPER-CLAD LAMINATE AND METHOD FOR PRODUCING PRINTED BOARD

(71) Applicant: AGC Inc., Tokyo (JP)

(72) Inventors: Seigo Kotera, Chiyoda-ku (JP); Wataru Kasai, Chiyoda-ku (JP); Junetsu Nakamura, Chiyoda-ku (JP); Takatoshi Yaoita, Chiyoda-ku (JP)

(73) Assignee: AGC Inc., Tokyo (JP)

(*) Notice: Subject to any disclaimer, the term of this patent is extended or adjusted under 35 U.S.C. 154(b) by 0 days.

(21) Appl. No.: 18/588,831

(22) Filed: Feb. 27, 2024

(65) Prior Publication Data

US 2024/0199829 A1    Jun. 20, 2024

Related U.S. Application Data

(60) Division of application No. 17/021,054, filed on Sep. 15, 2020, now abandoned, which is a continuation of
(Continued)

(30) Foreign Application Priority Data

Apr. 20, 2018    (JP) .................. 2018-081794

(51) Int. Cl.
*C08J 5/18*    (2006.01)
*B29C 71/02*    (2006.01)
(Continued)

(52) U.S. Cl.
CPC ............ *C08J 5/18* (2013.01); *B29C 71/02* (2013.01); *C08F 214/265* (2013.01);
(Continued)

(58) Field of Classification Search
CPC .......... C08J 5/18; C08J 5/121; C08J 2327/18; B29C 71/02; B29C 2071/022;
(Continued)

(56) References Cited

U.S. PATENT DOCUMENTS 4,510,300 A    4/1985    Levy
4,510,301 A    4/1985    Levy
(Continued)

FOREIGN PATENT DOCUMENTS

JP    61-64833 A    4/1986
JP    63-280618 A    11/1988
(Continued)

OTHER PUBLICATIONS

International Search Report issued Jul. 16, 2019 in PCT/JP2019/016355 filed Apr. 16, 2019, 2 pages.
(Continued)

*Primary Examiner* — Travis M Figg
(74) *Attorney, Agent, or Firm* — Oblon, McClelland, Maier & Neustadt, L.L.P.

(57) ABSTRACT

To provide a dielectric film which is excellent in dielectric properties and stability in the electric corrosion test and which is suitable for producing a high-precision printed board.
A roll film comprising a melt-processable fluororesin as the main component and having a thickness of from 1 to 100 μm, the dimensional change rate of which is less than 1.0%, in terms of an absolute value, in each of MD and TD, when heated at 150° C. for 30 minutes and then cooled to 25° C., based on the dimension at 25° C.

6 Claims, 4 Drawing Sheets

Related U.S. Application Data application No. PCT/JP2019/016355, filed on Apr. 16, 2019.

(51) Int. Cl.
*B29K 27/18* (2006.01)
*B29K 105/00* (2006.01)
*C08F 214/26* (2006.01)
*C08J 5/12* (2006.01)
*H05K 1/05* (2006.01)
*H05K 3/02* (2006.01)

(52) U.S. Cl.
CPC .............. *C08J 5/121* (2013.01); *H05K 1/056* (2013.01); *H05K 3/022* (2013.01); *B29C 2071/022* (2013.01); *B29K 2027/18* (2013.01); *B29K 2105/0085* (2013.01); *C08F 2800/10* (2013.01); *C08J 2327/18* (2013.01); *H05K 2201/015* (2013.01)

(58) Field of Classification Search
CPC . C08F 214/265; C08F 2800/10; H05K 1/056; H05K 3/022; H05K 2201/015; B29K 2027/18; B29K 2105/0085
See application file for complete search history.

(56) References Cited

U.S. PATENT DOCUMENTS

| | | |
|---|---|---|
| 2002/0020440 A1 | 2/2002 | Yoshimine et al. |
| 2008/0032144 A1 | 2/2008 | Hashimoto et al. |
| 2016/0078979 A1* | 3/2016 | Hosoda ................ B29C 65/022 428/421 |
| 2017/0130009 A1* | 5/2017 | Hosoda ................ B32B 27/08 |
| 2020/0290315 A1 | 9/2020 | Hiramatsu et al. |

FOREIGN PATENT DOCUMENTS

| | | | |
|---|---|---|---|
| JP | S63280618 A | * | 11/1988 |
| JP | S64-64833 A | | 3/1989 |
| JP | 2-90692 A | | 3/1990 |
| JP | 2002-83978 A | | 3/2002 |
| JP | 2002-240144 A | | 8/2002 |
| JP | 4880911 B2 | | 2/2012 |
| JP | 2013-147026 A | | 8/2013 |
| JP | 2014-223799 A | | 12/2014 |
| JP | 2015-106629 A | | 6/2015 |
| JP | 2015-146469 A | | 8/2015 |
| JP | 2016-27139 A | | 2/2016 |
| WO | WO 2005/110718 A1 | | 11/2005 |
| WO | WO-2016017801 A1 | * | 2/2016 ........... B32B 27/281 |
| WO | WO 2016/104297 A1 | | 6/2016 |
| WO | WO 2017/150678 A1 | | 9/2017 |

OTHER PUBLICATIONS

Nakayama, H., "Required Quality and Evaluation Method for Plating Layer of Printed Wiring Substrates," Journal of the Surface Finishing Society of Japan vol. 53, No. 2, 2002, 6 pages.
Fluoropolymer Handbook of Daikin Industries, Ltd (2009), 4. Neoflon@ PFA, (with English translation), 6 pages.
WO-2016104297-A1 English Translation (Year: 2016).
J P-63280618-A English Translation (Year: 1988).
Daikin Neoflon® PFA: Product Information Guide, 3 pages, published Jun. 1, 2017.

* cited by examiner

ROLL FILM, METHOD FOR PRODUCING ROLL FILM, METHOD FOR PRODUCING COPPER-CLAD LAMINATE AND METHOD FOR PRODUCING PRINTED BOARD

CROSS-REFERENCE TO RELATED APPLICATIONS

This is a divisional of U.S. patent application Ser. No. 17/021,054 filed on Sep. 15, 2020, which is a continuation of International Patent Application No. PCT/JP2019/016355, filed on Apr. 16, 2019, which claims priority to Japanese Patent Application No. 2018-081794, filed on Apr. 20, 2018. The contents of these applications are hereby incorporated by reference in their entireties.

TECHNICAL FIELD

The present invention relates to a roll film and methods for producing a roll film, a copper-clad laminate and a printed board.

BACKGROUND ART

Applications of printed boards extend over various electric appliances and systems such as cell phones, personal computers, automobiles, online systems and satellites. In recent years, high frequency signals tend to be used, and patterned circuits of printed boards tend to be finer, since the volume of information is increasing.

In production of printed boards, a copper-clad laminate having a copper foil laminated on a surface of a dielectric film is used in general. In production of a single-side board having the simplest structure, a circuit pattern to be obtained is formed on a copper foil of a copper-clad laminate by screen printing or baking and development of a photosensitive adhesive film and used, as an etching resist for etching the copper foil.

In production of a double-side board and a multi-layer board, through-hole plating is employed for interlayer connection in many cases. In general, in the through-hole plating, inside of a hole for the interlayer connection and a board surface are covered with a copper plating film by full plating so-called panel plating. A circuit pattern is formed by collectively etching a copper foil and a copper plating film formed thereon. In recent fine circuit boards, a thin copper foil having a thickness of at most 12 μm is used in many cases for improving the etching accuracy. Particularly, for forming fine patterns such as a line and space pattern having a line width of 50 μm and a space width of about 50 μm, the copper thickness at the time of forming the circuit is reduced, and the etching accuracy can be easily improved by using an ultrathin plating copper foil having a thickness of 5 μm.

The evaluation of finish state and the reliability test are conducted on through-hole plated printed boards. The evaluation of finish state includes three tests of plating thickness, plating shape and plating physical property. The reliability test focuses on a fatigue lifespan evaluation by temperature cycle and an insulating lifespan evaluation under constant temperature-constant humidity bias so-called electrolytic corrosion test. In the electrolytic corrosion test, an inter-pattern insulating reliability test using comb form patterns has been known as an important reliability test (Non-Patent Document 1).

As the dielectric film, a polyimide film (Patent Document 1) and a film (Patent Document 2) made of at least one member selected from the group consisting of a polyphenylene ether resin, a polyether sulfone resin, a polyether ether ketone resin and a fluororesin have been known.

PRIOR ART DOCUMENTS

Patent Documents

Patent Document 1: Japanese Patent No. 4,880,911
Patent Document 2: JP-A-2015-146469

Non-Patent Documents

Non-Patent Document 1: Hajime NAKAYAMA, Journal of the Surface Finishing Society of Japan Vol. 53, (Issue 2), p. 110-115 (2002)

DISCLOSURE OF INVENTION

Technical Problem

The electrolytic corrosion test is a constant temperature-constant humidity bias test between through-holes or between a through-hole and an inner pattern and employed as a comprehensive evaluation test for the stability of through-hole plated parts of e.g. a plating film, a board and production state. A dielectric film which is excellent in dielectric characteristics and stability in the electrolytic corrosion test is desired for producing a high-precision printed board. However, the film of Patent Document 1 has a high relative dielectric constant, whereby a high transmission property cannot be realized. The film of Patent Document 2 is poor in the stability in the electrolytic corrosion test.

It is known that fluororesin films are excellent in the dielectric characteristics. However, the present inventors have found that printed boards produced by using a roll film of such a fluororesin film are still insufficient in the stability in the electrolytic corrosion test, and its cause is the dimension stability of the roll film. Thus, it is difficult to efficiently produce a printed board having excellent stability in the electrolytic corrosion test by using a roll film of a fluororesin.

The present inventors have conducted extensive studies and as a result, obtained a roll film of a fluororesin which is excellent in the dimensional stability of a predetermined thickness, which is suitable to produce a high-precision printed board.

It is an object of the present invention to provide a roll film of a fluororesin which is suitable to efficiently produce a printed board excellent in the stability in the electrolytic corrosion test, its production method and methods for producing a copper-clad laminate and a printed board which use the roll film.

Solution to Problem

The present invention provides a roll film, a method for producing a roll film, a method for producing a copper-clad laminate and a method for producing a printed board, which have the following embodiments [1] to [15].

[1] A roll film comprising a melt-processable fluororesin as the main component and having a thickness of from 1 to 100 μm, the dimensional change rate of which is less than 1.0%, in terms of an absolute value, in each of MD and TD, when heated at 150° C. for 30 minutes and then cooled to 25° C., based on the dimension at 25° C.

[2] The roll film according to [1], wherein the ratio of the tension when wound to the dimensional change rate, in terms of an absolute value, in MD is from 100 to 1,000,000.

[3] The roll film according to [1] or [2], which is used for a copper-clad laminate.

[4] The roll film according to any one of [1] to [3], wherein the melt-processable fluororesin is a fluororesin having units derived from tetrafluoroethylene and units derived from a perfluoro(alkyl vinyl ether).

[5] The roll film according to any one of [1] to [4], wherein the melt-processable fluororesin is a fluororesin having a functional group having an ion scavenging function.

[6] The roll film according to any one of [1] to [5], which comprises a melt-processable fluororesin having a functional group having an ion scavenging function and a melt-processable fluororesin other than the above melt-processable fluororesin as the main component.

[7] The roll film according to any one of [1] to [6], which has a layer of the melt-processable fluororesin and a layer of a melt-processable fluororesin having a functional group having an ion scavenging function.

[8] The roll film according to any one of [5] to [7], wherein the functional group having an ion scavenging function is at least one member selected from the group consisting of a carbonyl group, a carboxy group, a carboxylic acid anhydride group (—C(=O)—O—C(=O)—), a carboxylate group, a sulfonyl group, a sulfo group and a sulfonic acid anhydride group (—S(=O)$_2$—O—S(=O)$_2$—).

[9] The roll film according to any one of [1] to [8], which has a thickness of from 3 to 75 μm.

[10] A method for producing the roll film as defined in any one of [1] to [9], which comprises subjecting a film comprising the melt-processable fluororesin as the main component and having a thickness of from 1 to 100 μm to annealing treatment at from a temperature lower by 210° C. than the melting temperature (Tm) of the melt-processable fluororesin to a temperature lower by 20° C. than Tm and then winding the film.

[11] The method according to [10], wherein the annealing treatment is carried out with a tension of at most 10 N/m applied to the film.

[12] The method according to [10] or [11], wherein the film is wound with a tension of at most 500 N/m applied to the film.

[13] A method for producing a copper-clad laminate, which comprises unwinding the roll film as defined in any one of [1] to [9] and forming a copper layer on a surface of the unwound film.

[14] The method according to [13], which forms a copper layer having an AC resistance value of higher than $1.0 \times 10^{-9}$ Ω·cm.

[15] A method for producing a printed board, which comprises producing a copper-clad laminate by the method as defined in [13] or [14] and etching the copper layer to form a patterned circuit.

Advantageous Effects of Invention

According to the roll film of the present invention, it is possible to obtain a printed board which is excellent in the stability in the electrolytic corrosion test.

DESCRIPTION OF EMBODIMENTS

Figure 1:
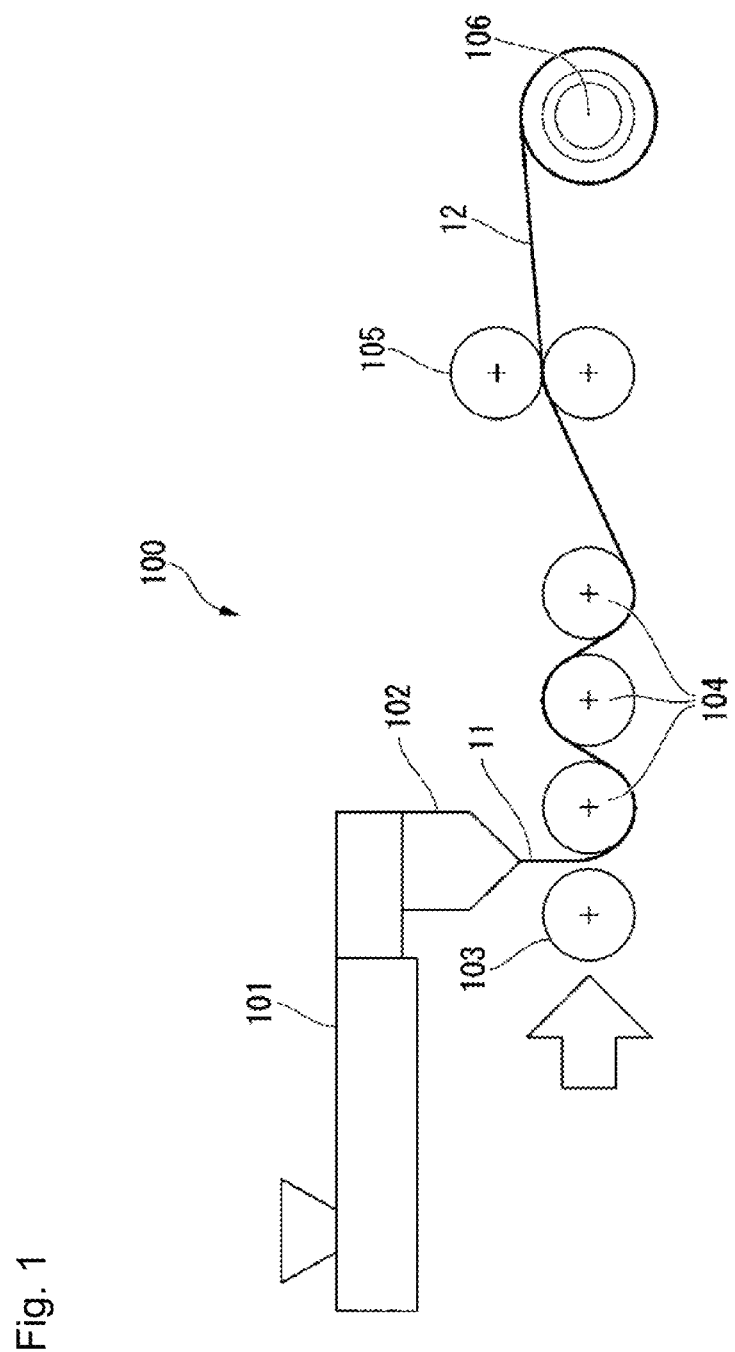
FIG. 1 is a view schematically illustrating an example of an untreated film production apparatus 100.

In this specification, the meanings of the following terms are as follows.

"MD" means a machine direction, and "TD" means a transverse direction at right angles to MD.

"Dimensional change rate" is a dimensional change rate when heated to 150° C. for 30 minutes and then cooled to 25° C. based on the dimension at 25° C. and is obtained by the method described in the after described Examples.

"Melt-processable resin" means a melt flowable resin and means a resin having a temperature at which the melt flow rate is from 0.1 to 1,000 g/10 min at a temperature higher by 20° C. than the melting point of the resin under a condition of a load of 49N.

"Melt flow rate" means a melt mass flow rate (MFR) of a resin stipulated in JIS K7210: 1999 (ISO1133: 1997).

"Melting temperature" means a temperature corresponding to the maximum value of the melting peak of a resin measured by differential scanning calorimetry (DSC) method.

"Glass transition temperature" (hereinafter referred to also as Tg) is one of transition temperatures which results from the molecular state in an amorphous region of a resin, and at a temperature lower than Tg, the main chain of the resin is frozen, and the resin becomes glass state. Tg means a temperature corresponding to a temperature showing the maximum value of tan δ peak measured by the dynamic viscoelasticity measurement (DMA) of a film.

"Unit" in a resin (polymer) means an atomic group formed by polymerization of a monomer and derived from the monomer. The unit may be a unit directly formed by a polymerization reaction or may be a unit wherein a part of the unit is converted to another structure by treatment of the polymer. Hereinafter, the unit derived from a monomer may be simply referred to as "unit of a monomer".

The expression "to" showing a numerical range is used to include the numerical values before and after it as the lower limit value and the upper limit value.

Dimensional ratios in FIG. 1 to FIG. 7 are different from actual ratios for explanatory convenience.

The roll film of the present invention comprises a melt-processable fluororesin (hereinafter referred to also as "fluororesin") as the main component, has a thickness of from 1 to 100 μm and has the dimensional change rate that is less than 1.0%, in terms of an absolute value, in each of MD and TD, when heated at 150° C. for 30 minutes and then cooled to 25° C., based on the dimension at 25° C. The roll film of the present invention is a wound roll film and preferably a long (belt-like) film wound into a roll form.

The fluororesin in the present invention is a melt-processable resin having units of a fluoroolefin. The fluoroolefin is preferably tetrafluoroethylene (TFE), chlorotrifluoroethylene (CTFE), vinylidene fluoride (VDF) or vinyl fluoride (VF), particularly preferably TFE.

The melting temperature of the fluororesin is preferably from 260 to 320° C., particularly preferably from 280 to 310° C.

MFR of the fluororesin is preferably from 0.1 to 100 g/10 min, more preferably from 1 to 40 g/10 min, particularly preferably from 5 to 30 g/10 min, under a condition of a load of 49N at a temperature higher by 20° C. than the melting temperature of the fluororesin. In such a case, the balance between the processing property of the fluororesin and the mechanical strength of the roll film tends to be good.

The relative dielectric constant of the fluororesin is preferably at most 3.0, more preferably at most 2.5, particularly preferably at most 2.2. The lower limit of the relative dielectric constant is, for example, 1.8. In such a case, the roll film is excellent in electric characteristics, and a printed board excellent in the transmitting efficiency is obtained.

The relative dielectric constant of the fluororesin may, for example, be controlled by the type or the content of units of the fluoroolefin contained in the fluororesin.

The storage elastic modulus of the fluororesin is, for example under the annealing treatment conditions in the after-mentioned method for producing the roll film, preferably at least 1 MPa, more preferably at least 10 MPa, particularly preferably at least 20 MPa. From the viewpoint of the flexibility of the fluororesin required for continuous treatment, the upper limit value is 100 MPa. Here, the storage elastic modulus can be measured by solid dynamic viscoelasticity measurement or the like.

As the fluororesin, a fluororesin (PFA) having units of TFE and units of a perfluoro(alkyl vinyl ether) (PAVE), a fluororesin (FEP) having units of TFE and units of hexafluoropropylene (HFP), a fluororesin (ETFE) having units of TFE and units of ethylene, a fluororesin (PVDF) having units of VDF, a fluororesin (PCTFE) having units of CTFE and a fluororesin (ECTFE) having units of ethylene and units of chlorotrifluoroethylene may be mentioned. PFA is preferred, since a printed board more excellent in the dimensional stability and the flex resistance and the stability in the electrolytic corrosion test can be obtained. PFA preferably has from 92 to 99 mol % of the units of TFE, and from 1 to 8 mol % of the units of PAVE, to all units, whereby a roll film which is excellent in the dimensional stability and which has a predetermined thickness can be obtained.

The fluororesin is preferably a fluororesin (hereinafter referred to also as "fluororesin i") having a functional group (hereinafter referred to also as "functional group i") having an ion scavengering function.

The functional group i is a functional group having a function of scavengering ionic substances, when annealing treatment is carried out at a temperature of at least 80° C. and at most 300° C. It is considered that the main factor of the electrolytic corrosion phenomenon is corrosion phenomenon. The corrosion phenomenon results, since ions generated by electrochemical reactions or deterioration of materials for forming a circuit, or ionic substances (hydrogen chloride in air, dusts having NOx, SOx or the like adsorbed, deposits such as an oil component, countercations derived from various additives contained in other board-constituting materials such as soldering flux or an insulating adhesive layer) incorporated from outside by surface adhesion or the like move by migration or electric force and electrochemically react on a surface of a substance having an electrode function. It is considered that the functional group i reacts with the ionic substances which may cause electrolytic corrosion and fixes or inactivates the unnecessary ionic substance.

The functional group i is preferably at least one member selected from the group consisting of a carbonyl group, a carboxy group, a carboxylic acid anhydride group (—C(=O)—O—C(=O)—), a carboxylate group, a sulfonyl group, a sulfo group and a sulfonic acid anhydride group (—S(=O)$_2$—O—S(=O)$_2$—) from the viewpoint of the ion scavengering function and thermal stability, and is particularly preferably a carboxy group, a carboxylic acid anhydride group or a carboxylate group, which is not ionized.

The functional group i in the fluororesin i may be derived from a monomer having the functional group i, may be derived from a polymerization initiator or a chain transfer agent or may be derived from a compound having the functional group i graft-polymerized to the fluororesin.

The monomer having the functional group i may, for example be a cyclic monomer having the after-mentioned carboxylic acid anhydride group, a perfluoro[2-(fluorosulfonylethoxy)propyl vinyl ether] or methylperfluoro-5-oxy-6-heptanoate (hereinafter referred to also as "MXM").

The content of the functional group i in the fluororesin i is preferably from 10 to 60,000 groups, more preferably from 300 to 5,000 groups, per 1×10$^6$ carbon atoms of the main chain of the fluororesin i, from the viewpoint of the melting temperature of the fluororesin i. In such a case, the balance among the stability in the electrolytic corrosion test of a copper-clad laminate produced by using a roll film as in the form of a printed board, the adhesion between the roll film to be unwound and a copper layer and the heat resistance, the mechanical property and the electric characteristics of the roll film will be good.

The content of the functional group i can be measured by a method such as nuclear magnetic resonance analysis or infrared absorption spectrum analysis and can, for example, be calculated from the proportion (mol %) of units having the functional group i to all units of the fluororesin i by the method described in JP-A-2007-314720.

As the fluororesin i, a fluororesin having units having the functional group i or a terminal group having the functional group i may be mentioned. As specific examples, a melt-processable polytetrafluoroethylene having the functional group i, PFA having the functional group i, FEP having the functional group i, an ethylene/TFE type copolymer (ETFE) having the functional group i, a TFE/perfluoro[2-(fluorosulfonylethoxy)prolyl vinyl ether] type copolymer (e.g. Nafion manufactured by Dupont), and a TFE/MXM copolymer and an acid type exchanged resin thereof (e.g. Flemion, manufactured by AGC Inc.) may be mentioned. The fluororesin i may be a mixture of two or more types. Here, "type" in the above copolymers means that the copolymers may further have units of another monomer.

The fluororesin i is preferably PFA having the functional group i, FEP having the functional group i or the TFE/MXM polymer with a view to satisfying both the content of fluorine and processability.

The fluororesin i is preferably a fluororesin having units having the functional group i. In such a case, the ion scavengering function and the adhesion to various substrates such as a metal foil tend to be further improved.

The fluororesin is preferably a fluororesin (hereinafter referred to also as "fluororesin ii") having units u1 of TFE or CTFE, units u2 of a cyclic monomer having a carboxylic acid anhydride group or MXM and units u3 of a fluorinated monomer, since the adhesion at an interface between an unwound roll film and a copper layer and the electric characteristics of a roll film will be further excellent.

The monomer constituting the units u1 is preferably TFE, since the heat resistance will be excellent.

The cyclic monomer may, for example, be itaconic acid anhydride (IAH), citraconic acid anhydride (CAH), 5-norbornene-2,3-dicarboxylic acid anhydride (NAH) or maleic acid anhydride. As the cyclic monomer, one type may be used alone, or two or more types may be used in combination.

The cyclic monomer is preferably IAH, CAH and NAH, and from the viewpoint of further excellent adhesion, IAH and NAH are preferred.

The fluororesin ii may have units having a dicarboxylic group (such as itaconic acid, citraconic acid, 5-norbornene-2,3-dicarboxylic acid or maleic acid) formed by hydrolysis of a part of the carboxylic acid anhydride group in the units u2 in some cases. In such a case, the content of the above units is included in the content of the units u2.

The fluorinated monomer constituting the units u3 may, for example, be a fluoroolefin (such as VF, VDF, $CF_2$=CHF, HFP or hexafluoroisobutylene) other than TFE and CTFE, PAVE, $CF_2$=$CFOCF_2CF(CF_3)OCF_2CF_2SO_2F$, $CF_2$=$CFOCF_2CF(CF_3)OCF_2CF_2SO_3H$, $CF_2$=$CFCF_2OCF$=$CF_2$, $CF_2$=$CFCF_2CF_2OCF$=$CF_2$, a fluoroalkylethylene (FAE), perfluoro(2,2-dimethyl-1,3-dioxol), 2,2,4-trifluoro-5-trifluoromethoxy-1,3-dioxol or perfluoro(2-methylene-4-methyl-1,3-dioxolane).

The fluorinated monomer is a fluorinated monomer other than TFE and CTFE, and is preferably at least one member selected from the group consisting of HFP, PAVE and FAE, particularly preferably PAVE in view of excellent processability of the fluororesin ii and the flex resistance of a roll film.

As PAVE, $CF_2$=$CFOCF_2CF_3$, $CF_2$=$CFOCF_2CF_2CF_3$ (PPVE), $CF_2$=$CFOCF_2CF_2CF_2CF_3$ and $CF_2$=$CFO(CF_2)_8F$ may be mentioned, and PPVE is preferred.

As FAE, $CH_2$=$CF(CF_2)_2F$, $CH_2$=$CF(CF_2)_3F$, $CH_2$=$CF(CF_2)_4F$, $CH_2$=$CF(CF_2)_5F$, $CH_2$=$CF(CF_2)_8F$, $CH_2$=$CF(CF_2)_2H$, $CH_2$=$CF(CF_2)_3H$, $CH_2$=$CF(CF_2)_4H$, $CH_2$=$CF(CF_2)_5H$, $CH_2$=$CF(CF_2)_8H$, $CH_2$=$CH(CF_2)_2F$, $CH_2$=$CH(CF_2)_3F$, $CH_2$=$CH(CF_2)_4F$, $CH_2$=$CH(CF_2)_5F$, $CH_2$=$CH(CF_2)_6F$, $CH_2$=$CH(CF_2)_8F$, $CH_2$=$CH(CF_2)_2H$, $CH_2$=$CH(CF_2)_3H$, $CH_2$=$CH(CF_2)_4H$, $CH_2$=$CH(CF_2)_5H$, $CH_2$=$CH(CF_2)_8H$, etc. may be mentioned, and $CH_2$=$CH(CF_2)_4F$(PFBE) and $CH_2$=$CH(CF_2)_2F$(PFEE) are preferred.

The preferred proportions of respective units to the total amount of the units u1, the units u2 and the units u3 in the fluororesin ii are as described below from the viewpoint of the flame resistance, the chemical resistance, etc. of a roll film.

The proportion of the units u1 is preferably from 90 to 99.89 mol %, more preferably from 95 to 99.47 mol %, further preferably from 96 to 98.95 mol %.

The proportion of the units u2 is preferably from 0.01 to 3 mol %, more preferably from 0.03 to 2 mol %, further preferably from 0.05 to 1 mol %. In a case of such a fluororesin ii, the adhesion at an interface between an unwound roll film and a copper layer will be further excellent.

The proportion of the units u3 is preferably from 0.1 to 9.99 mol %, more preferably from 0.5 to 9.97 mol %, further preferably from 1 to 9.95 mol %. In such a case, the processability of the fluororesin ii, the flex resistance of a roll film, etc. will be further excellent.

The proportion of the respective units can be calculated by melt NMR analysis, fluorine content analysis, infrared absorption spectrum analysis, etc. of the fluororesin ii.

The fluororesin ii may further have units u4 of another monomer.

Such another monomer may, for example, be an olefin (such as ethylene, propylene or 1-butene) or a vinyl ester (such as vinyl acetate). As another monomer, one type may be used alone, or two or more types may be used in combination. Such another monomer is preferably ethylene, propylene or 1-butene, particularly preferably ethylene, from the viewpoint of the mechanical strength of a roll film, etc.

As specific examples of the fluororesin ii, a TFE/NAH/PPVE copolymer, a TFE/IAH/PPVE copolymer, a TFE/CAH/PPVE copolymer, a TFE/IAH/HFP copolymer, a TFE/CAH/HFP copolymer, a TFE/IAH/PFBE/ethylene copolymer, a TFE/CAH/PFBE/ethylene copolymer, a TFE/IAH/PFEE/ethylene copolymer, a TFE/CAH/PFEE/ethylene copolymer and a TFE/IAH/HFP/PFBE/ethylene copolymer may be mentioned.

The fluororesin ii is preferably PFA having the functional group i, more preferably PFA having units having the functional group i, particularly preferably a TFE/NAH/PPVE copolymer, a TFE/IAH/PPVE copolymer or a TFE/CAH/PPVE copolymer.

The roll film of the present invention comprises the fluororesin as the main component, and its content is preferably from 50 to 100 mass %, more preferably from 80 to 100 mass %. The roll film may further contain a resin other than the fluororesin, an additive or the like. Further, components used for producing the fluororesin (such as a surfactant for the polymerization) are not included in other components.

Other resin may, for example, be a non-melt-processable fluororesin, a fluorinated elastomer or a resin containing no fluorine atom.

The fluorinated elastomer is preferably an elastomer having units of at least one fluoroolefin selected from the group consisting of TFE, HFP, VDF and CTFE. Specifically, the TFE/propylene type copolymer mentioned in JP-A-H05-78539, the VDF/HFP copolymer, the VDF/HFP/TFE copolymer, etc. mentioned in JP-A-H11-124482, and the fluorinated polymer having units of TFE and having units of $CF_2$=$CFOCF_3$ mentioned in JP-A-2006-089720, etc. may be mentioned. These polymers may further have units of another monomer.

The resin having no fluorine atom may, for example, be a polyester, a polyolefin, a styrene type resin, a urethane resin, a polyoxymethylene, a polyamide, a polycarbonate, a polymethyl methacrylate, a polyvinyl chloride, a polyphenylene sulfide, polyphenylene ether, a modified polyphenylene ether, a polyimide, a polyamideimide, a polyether imide, a polysulfone, a modified polysulfone, a polyethersulfone, a polyketone, a polyether ketone, a polyether ether ketone, a polyether ketone ketone, a polyarylate, a polyether nitrile, a phenol resin, a phenoxy resin or an epoxy resin.

The additive may, for example, be an inorganic filler or an organic filler.

The inorganic filler may, for example, be silica, hollow silica, clay, talc, calcium carbonate, mica, diatomaceous earth, alumina, zinc oxide, titanium oxide, calcium oxide, magnesium oxide, iron oxide, tin oxide, antimony oxide, calcium hydroxide, magnesium hydroxide, aluminum hydroxide, basic magnesium carbonate, magnesium carbonate, zinc carbonate, barium carbonate, dawsonite, hydrotalcite, calcium sulfate, barium sulfate, calcium silicate, montmorillonite, bentonite, activated white clay, sepiolite, imogolite, sericite, glass fibers, glass beads, silica balloons, carbon black, carbon nanotubes, carbon nanohorns, graphite, carbon fibers, glass balloons, carbon balloons, wood flower or zinc borate. The inorganic filler may be porous or non-porous. The inorganic filler may be subjected to surface treatment with a surface treatment agent such as a silane coupling agent or a titanate coupling agent for improving the dispersibility in the resin. As the inorganic filler, one type may be used alone, or two or more types may be used in combination.

The organic filler is preferably a particulate filler containing other resin as the main component, particularly preferably a particulate filler made of a material having a low dielectric property, and a particulate filler of PTFE, a polystyrene or a polyolefin, a hollow filler of such a resin, etc. may be mentioned.

The fluororesin for a roll film may be one type of a fluororesin or may be two or more types of fluororesins. As a specific example of the latter case, an embodiment comprising the fluororesin i and a fluororesin other than the fluororesin i may be mentioned.

In the above embodiment, the fluororesin i is preferably the fluororesin ii, and the fluororesin other the fluororesin i is preferably PFA having no functional group i.

In the above embodiment, the proportion of the fluororesin i is preferably from 0.1 to 49 mass %, more preferably from 5 to 40 mass %, to the total amount of fluororesins in a roll film. The proportion of the fluororesin other than the fluororesin i is preferably from 51 to 99.9 mass %, more preferably from 60 to 95 mass %.

The roll film may consist of only a film of the fluororesin or may be formed on a surface of other substrate. In the former case, the roll film may consist of a film having one layer of the fluororesin or may consist of a film having two or more layers of the fluororesin. In the latter case, as other substrate, a film of a fluororesin may be used.

The thickness of the roll film of the present invention is from 1 to 100 µm, more preferably from 3 to 75 µm, particularly preferably from 3 to 50 µm. When the thickness of the roll film is at least the lower limit value of the above range, the forming property of the copper-clad laminate is excellent. When the thickness of the roll film is at most the upper limit value of the above range, a thin printed board can be formed, and the multi-layer forming property is excellent. As a further specific embodiment of the thickness of the roll film, a thin film embodiment of from 3 to 30 µm and a thick film embodiment of from 30 to 60 µm may be mentioned.

In the roll film of the present invention, the dimensional change rate, in terms of an absolute value, in each of MD and TD is less than 1.0%, when heated at 150° C. for 30 minutes and then cooled to 25° C., based on the dimension at 25° C. Hereinafter, the former absolute value is referred to also as "change rate MD", and the latter absolute value is referred to as "change rate TD".

Roll films made of conventional melt-processable fluororesins have residual forming strain due to its production method (melt molding by extrusion or the like). The dimensional change rate of such roll films thereby exceeds 1.0%. Under such circumstances, in the present invention, the dimensional change rate of a roll film in each of MD and TD is suppressed within a predetermined range, and the electrolytic corrosion is suppressed, by controlling the thickness of the film of a fluororesin and the after-mentioned annealing treatment conditions and winding conditions of the film.

Accordingly, a high-precision copper-clad laminate can be obtained by unwinding the roll film of the present invention and forming a copper layer thereon, and a printed board of which electrolytic corrosion is suppressed can be obtained.

The change rate MD is preferably less than 0.5%, preferably at most 0.1%, more preferably at most 0.08%, particularly preferably at most 0.05%.

The change rate TD is preferably less than 0.5%, preferably at most 0.1%, more preferably at most 0.08%, particularly preferably at most 0.05%.

In the roll film of the present invention, the ratio of winding tension to the change rate MD is preferably from 100 to 1,000,000, particularly preferably from 300 to 10,000. In such a case, the dimensional stability of the roll film tends to further improve.

Further, the ratio of the change rate MD to the change rate TD is preferably at most 5, particularly preferably at most 3. In such a case, if the roll film is long, a more high-precision printed board can be produced. The lower limit of the above ratio is usually 1.

The relative dielectric constant of the roll film is preferably at most 3.0, more preferably at most 2.5, particularly preferably at most 2.2. The lower limit of the relative dielectric constant is, for example, 1.8. In such a case, the transmission efficiency of a printed board to be obtained from the roll film will be further excellent.

The roll film of the present invention is used for a copper-clad laminate. Specifically, the roll film is unwound and laminated with a copper layer to form a copper-clad laminate.

According to the above-described roll film, a printed board excellent in the stability in the electrolytic corrosion test can be obtained from the copper-clad laminate in which the roll film is used.

Further, when the fluororesin has the functional group i, the adhesion between the roll film and the copper layer will be improved.

Further, it is considered that the main factor of the electrolytic corrosion phenomenon is corrosion phenomenon due to ionic substances.

When the fluororesin has the functional group i, the ionic substances are fixed or inactivated by the functional group i, whereby a printed board more excellent in the stability in the electrolytic corrosion test can be obtained. Further, the functional group i chemically bonds to the main chain of the fluororesin, whereby the mobility of the functional group i in a film is low, as compared with a case where a fluororesin contains a low molecular material having the functional group i. It is thereby considered that electric field generated at the time of applying electrical current to a circuit, ionic conduction due to magnetic field or the like, diffusion, etc. can be suppressed, whereby the effect of fixing or inactivating ionic substances is high.

In the method for producing a roll film of the present invention, a film comprising a fluororesin as the main component and having a thickness of from 1 to 100 µm (hereinafter referred to also as "untreated film") is subjected to annealing treatment at a temperature of from a temperature lower by 210° C. than the melting temperature (hereinafter referred to also as "Tm") of the fluororesin to a temperature lower by 20° C. than Tm, and the film is wound.

The untreated film has each of change rate MD and change rate TD of higher than 1.0%, typically each of higher than 1.0% and at most 5%.

The specific temperature for the annealing treatment is at least (glass transition temperature of the fluororesin +10° C.) and at most (the melting temperature of the fluororesin −20°

C.), and in the case of normal fluororesins (PFA having a melting temperature of from 260 to 320° C., etc.), it is from 80 to 300° C.

In the annealing treatment, tension is preferably applied toward MD of a film.

The tension at that time is preferably at most 10 N/m, particularly preferably at most 5 N/m. The lower limit of the tension at that time is usually 1 N/m.

When winding an anneal-treated film, tension (hereinafter referred to also as "winding tension") is preferably applied toward MD of the film. The winding tension is preferably at most 500 N/m, more preferably at most 300 N/m, particularly preferably at most 150 N/m. The lower limit of the tension at that time is usually 1 N/m. Further, the ratio of the winding tension to the change rate MD in terms of an absolute value is preferably from 100 to 1,000,000, particularly preferably from 300 to 10,000.

Here, each tension (N/m) is a value per MD 1 m of the film and, in an actual film treatment apparatus, it is obtained from tension measured by a film tension measuring apparatus and a film width (m) at that time. Such a film tension measuring apparatus may, for example, be trade name "Model 1FB-5000N" and "Model HD-500", manufactured by OHKURA INDUSTRY or a non-contact WEB tension meter, manufactured by Bellmatic. The winding tension is measured by installing a winding roll with a 3 inch ABS plastic tube (thickness of 6 mm) connected to such a measuring apparatus.

An example of the method for producing an untreated film will be described with reference to FIG. 1.

FIG. 1 is a view schematically illustrating an example of an untreated film production apparatus 100.

The production apparatus 100 has an extruder 101, a T die 102 installed to the extruder 101, a quenching roll 103, a plurality of cooling rolls 104, a pair of nip rolls 105 and a winding roll 106.

The plurality of cooling rolls 104 are installed in series so that a film form melt 11 discharged from the T die 102 will sequentially pass the plurality of cooling rolls 104 toward the side of the pair of nip rolls 105. Here, three cooling rolls 104 are illustrated, however, the number of the cooling rolls 104 is not limited to three and may be one.

The quenching roll 103 is installed opposite to the cooling roll 104 (hereinafter referred to also as "first quenching roll") which is the nearest to the T die 102 among the plurality of cooling rolls 104.

The untreated film is produced by the production apparatus 100 by the following procedure.

A material containing a fluororesin and as a case requires, a resin other than the fluororesin, an additive, etc. is melted by the extruder 101, the molten resin extruded from the extruder 101 is supplied to the T die 102, the molten resin is discharged from the T die 102 into a film form, the film-form melt 11 is pressed on the first cooling roll 104 by the quenching roll 103 and then brought into contact with the other cooling rolls 104 sequentially and thereby cooled, and conveyed so as to pass through the pair of nip rolls 105, whereby an untreated film 12 is formed. The obtained untreated film 12 is wound on the winding roll 106. As a case requires, the untreated film 12 may be cut into sheets.

The rip width of the T die 102 is not particularly restricted and may, for example, be from 500 to 4,000 mm.

The forming rate, that is discharge rate of the melt 11 from the T die 102, is preferably from 1 to 100 m/min, particularly preferably from 1 to 30 m/min. When the forming rate falls within the above range, the film flatness is excellent. When the forming rate is lower than the lower limit value of the above range, the melt 11 is cooled before being brought into contact with the cooling roll, whereby the film flatness may deteriorate. When the forming rate exceeds the upper limit value of the above range, film cooling is delayed, whereby the film flatness may deteriorate.

The distance from the discharge of the melt 11 from the T die 102 to the contact point of the first cooling roll 104 is preferably at most 500 mm, particularly preferably at most 300 mm. The lower limit of the above distance is, for example, 100 mm.

The surface temperature of the cooling roll 104 is less than Tm of the resin material and preferably at least room temperature and at most (Tm−20° C.).

The surface temperature of the quenching roll 103 may be the same as the surface temperature of the cooing roll 104.

In the above production method, the melt 11 is pressed on the first cooling roll 104 by the quenching roll 103, whereby the change rate MD at the time of the annealing treatment is low, whereby the change rate MD in terms of an absolute value can be suppressed under mild annealing treatment conditions. This is considered that the melt 11 is quenched, whereby the forming strain at film terminals is suppressed, and the uniformity of the strain in MD of the film is high.

Here, in the above production method, the melt 11 may be cooled without being pressed by the quenching roll 103.

When the fluororesin is the fluororesin i, ionic substances which may cause corrosion will be sufficiently fixed or inactivated by the functional group i, when heated in annealing treatment, whereby a printed board which is excellent in the stability in the electrolytic corrosion test tends to be obtained from the roll film. Further, the film-form retention property when annealed is also excellent.

The time for the annealing treatment may be appropriately set considering the desired dimensional change rate of the roll film and the temperature of the annealing treatment. The time for the annealing treatment is preferably from 1 to 60 minutes, particularly preferably from 1 to 30 minutes. When the annealing time is at least the lower limit value of the above range, a printed board which is excellent in the stability in the electrolytic corrosion test tends to be obtained from the roll film. When the annealing time is at most the upper limit value of the above range, the treatment efficiency is high, and a printed board can be industrially easily produced.

The annealing treatment is preferably carried out while applying tension to the untreated film. As such an embodiment, an example that an untreated film in the form of a roll is heated while being conveyed in MD by roll-to-roll processing, may be mentioned.

Tension applied to the untreated film in the annealing treatment is preferably at most 10 N/m, particularly preferably at most 5 N/m. When the tension is at most the above upper limit value, stress applied to the untreated film is low, and remaining stress in a roll film can thereby be reduced. When the remaining stress in the roll film is low, the dimensional stability of the roll film will be more excellent.

In a case where the untreated film is heated while being conveyed in MD by a roll to roll, tension (hereinafter referred to also as "conveyance tension") applied to the untreated film at the time of conveyance is preferably at least 1 N/m in a region heated for the annealing treatment. When the conveyance tension is at least the above lower limit value, the film can be stably conveyed.

In a case where the annealing treatment is carried out under applying tension to the untreated film, it is preferred that another substrate is laminated on the untreated film prior to the annealing treatment, and the annealing treatment is carried out under a state laminated with the substrate. Stress applied to the untreated film can be thereby easily controlled.

Another substrate may, for example, be a resin film.

The resin constituting the resin film may, for example, be a melt-processable fluororesin, a non-melt-processable fluororesin or a non-fluororesin. The non-fluororesin may, for example, be a polyester resin (such as a polyethylene terephthalate (PET) resin, a polyethylene naphthalate resin (PEN), etc.) or a polyimide resin.

The resin film is preferably a film of a fluororesin, since the coefficient of linear expansion of the untreated film is close to that of another substrate, and curling is less likely to be formed in the annealing treatment. The fluororesin constituting the film of the fluororesin is preferably a fluororesin of the same type as the fluororesin contained in the untreated film, since the linear expansion coefficient of the untreated film is close to that of the substrate, and curling is less likely to be formed in the annealing treatment. For example, in a case where the fluororesin is PFA, the resin constituting the resin film is preferably PFA. The fluororesin constituting the resin film may have no functional group i.

The thickness of the substrate is preferably from 25 to 100 μm.

The substrate may be directly laminated on the untreated film or may be laminated via an adhesive layer.

A laminate having the substrate directly laminated on the untreated film may, for example, be produced, in the above production method, by coextruding a resin material containing a melt-processable fluororesin and a resin material constituting a substrate film. Feed-block method or multi-manifold method can be employed in the above coextrusion process.

In a case where the substrate is laminated on the untreated film via an adhesive layer, an adhesive constituting the adhesive layer is not particularly restricted and may, for example, be an acrylic type, a silicone type, a urethane type or a polyolefin type.

The thickness of the adhesive layer is preferably from 0.1 to 5 μm, particularly preferably from 0.5 to 2 μm.

Figure 2:
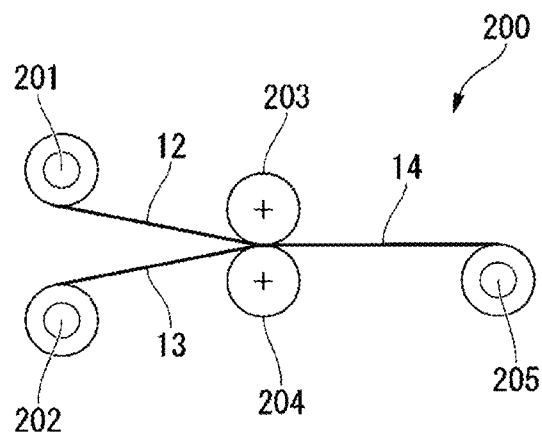
FIG. 2 is a view illustrating an example of a schematic structure of a bonding apparatus for bonding an untreated film and a substrate.
Figure 3:
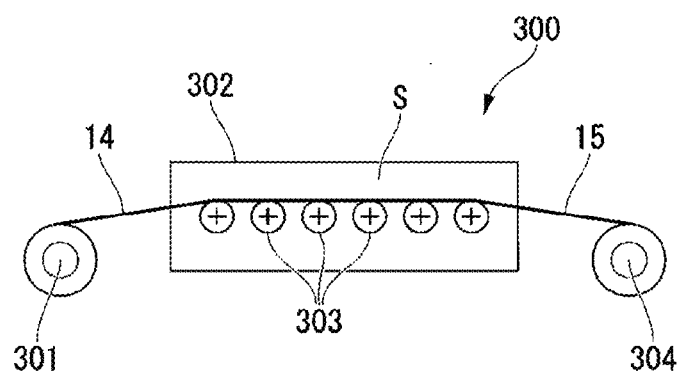
FIG. 3 is a view illustrating an example of a schematic structure of an annealing treatment apparatus.

Now, with reference to FIGS. 2 and 3, an example of the method for producing a roll film of the present invention will be described. FIG. 2 is a view illustrating an example of a schematic structure of a bonding apparatus for bonding an untreated film and a substrate. FIG. 3 is a view illustrating an example of a schematic structure of an annealing treatment apparatus.

The bonding apparatus 200 illustrated in FIG. 2 has a first unwinding roll 201 to sequentially unwind an untreated film 12 in a roll form, a second unwinding roll 202 to sequentially unwind a substrate 13 having an adhesive layer, which is wound in a roll form, a pair of bonding rolls 203 and 204 to bond the untreated film 12 and the substrate 13 having an adhesive layer thereby to form a laminate 14 and a winding roll 205 to wind the laminate 14.

The untreated film 12 and the substrate 13 having an adhesive layer are sandwiched by and pressed between the pair of bonding rolls 203 and 204 and thereby bonded.

The substrate 13 having an adhesive layer has an adhesive layer on one surface of the substrate, specifically on a surface at a side being in contact with the untreated film 12 when the substrate passes through the bonding roll 203.

The annealing treatment apparatus 300 illustrated in FIG. 3 has an unwinding roll 301 to sequentially unwind a laminate 14 wound in a film form, a heating portion 302 to heat the laminate 14, a plurality of conveying rolls 303 and a winding roll 304 to wind the heated laminate 14, that is a laminate 15 having a roll film and a substrate 13 having an adhesive layer.

The heating portion 302 has a space S into which the laminate 14 is conveyed, and the plurality of conveying rolls 303 are installed in the space S. Further, the heating portion 302 has a heating structure (not illustrated) to heat the laminate 14 conveyed into the space S.

In the annealing treatment apparatus 300, the unwinding rate and the winding rate of the laminate 14 are controlled by the unwinding roll 301 and the winding roll 304, whereby conveyance tension and winding tension applied to the laminate 14 being conveyed can be controlled.

In this example of the production method, a roll film is produced by the following procedure.

First, in the bonding apparatus 200, the untreated film 12 is conveyed from the first unwinding roll 201 to the bonding rolls 203 and 204, the substrate 13 having an adhesive layer is conveyed from the second unwinding roll 202 to the bonding rolls 203 and 204, the untreated film 12 and the substrate 13 having an adhesive layer are bonded by the bonding rolls 203 and 204, and the obtained laminate 14 is wound on the winding roll 205.

Next, the wound laminate 14 is transferred to the unwinding roll 301 in the annealing treatment apparatus 300, conveyed from the unwinding roll 301 to the heating portion 302 and heated at the heating portion 302, to form the untreated film 12 into a roll film, and a laminate 15 having the roll film and the substrate 13 having an adhesive layer is wound on the winding roll 304. As a case requires, the laminate 15 may be cut into sheets. As a case requires, the substrate 13 having an adhesive layer may be peeled from the laminate 15. The substrate 13 having an adhesive layer is usually peeled at the time of producing a copper-clad laminate.

A copper-clad laminate formed by using the roll film of the present invention has a dielectric layer made of an unwound roll film and a copper layer formed so as to be in contact with the dielectric layer.

Figure 4:
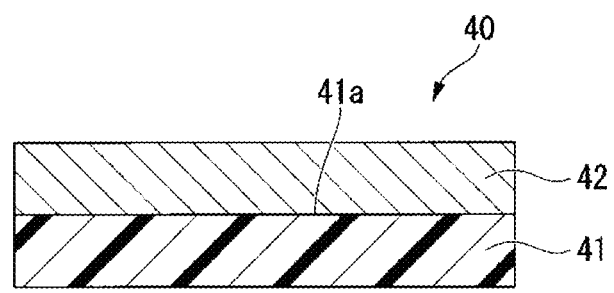
FIG. 4 is a cross-sectional view schematically illustrating an example of a copper-clad laminate.

FIG. 4 is a cross-sectional view schematically illustrating an example of a copper-clad laminate. A copper-clad laminate 40 illustrated in FIG. 4 has a dielectric layer 41 consisting of an unwound roll film, and a copper layer 42 laminated on a first surface 41a in the thickness direction of the dielectric layer 41.

Figure 5:
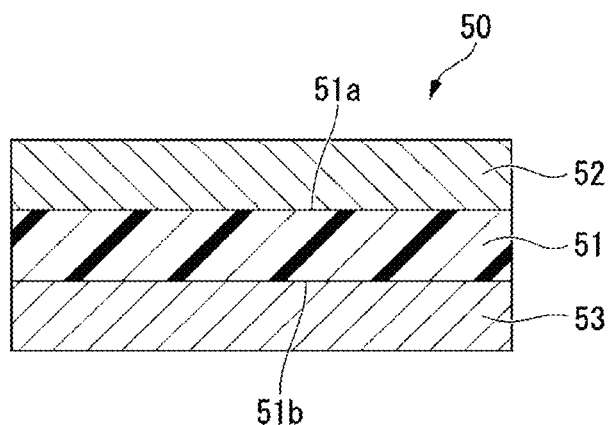
FIG. 5 is a cross-sectional view schematically illustrating another example of a copper-clad laminate.

FIG. 5 is a cross-sectional view schematically illustrating another example of a copper-clad laminate. A copper-clad laminate 50 illustrated in FIG. 5 has a dielectric layer 51 consisting of an unwound roll film, a first copper layer 52 laminated on a first surface 51a in the thickness direction of the dielectric layer 51 and a second copper layer 53 laminated on a second surface 51b on the side opposite from the first surface 51a of the dielectric layer 51.

The thickness of the copper layer is preferably from 3 to 18 μm. In a case where a fine circuit is formed, the thickness of the copper layer is preferably at most 12 μm.

The copper layer is preferably formed by using a copper foil. The copper foil may, for example, be a rolled copper foil or an electrolytic copper foil.

In the method for producing a copper-clad laminate of the present invention, the roll film of the present invention (or a film product manufactured by its production method) is unwound, and a copper layer is formed on its surface.

The copper layer may be formed on only a first surface in the thickness direction of the roll film, or on both the first surface and the second surface on the side opposite from the first surface.

The method for forming the copper layer on a surface of the unwound roll film may, for example, a method of laminating (bonding) a copper foil on a surfaces of the roll film, a vapor deposition method or a plating method.

The method for laminating a copper foil may, for example, be a method of hot press. The hot press temperature is preferably from the melting point of the dielectric film +20° C. to the melting point of the dielectric film +100° C. The hot press time may, for example, be from 1 to 30 minutes. The hot press pressure may, for example, be from 0.1 to 10 MPa.

The unwound roll film is preferably subjected to surface treatment before forming the copper layer in order to improve the adhesive between the copper layer and the unwound roll film. The surface treatment may, for example, be plasma treatment, corona treatment and ultraviolet ray (UV) application.

The obtained copper-clad laminate can be used as a material for a printed board.

The printed board is a plate component to electrically connect electronic components such as a semiconductor and a condenser chip and simultaneously to fix them in a limited space.

The construction of a printed board to be formed from the copper-clad laminate is not particularly restricted, and a known construction of a printed board may be employed. The printed board may be any one of a rigid board, a flexible board or a rigid flexible board. The printed board may be a single-side board, a double-side board or a multi-layer board (such as a buildup board).

In the method for producing a printed board of the present invention, the copper-clad laminate is produced by the above method for producing a copper-clad laminate, and the copper layer is etched to form a patterned circuit.

As the etching method of the copper layer, a known method may be employed.

In the production of a printed board, after etching the copper layer to form a patterned circuit, an interlayer insulation film may be formed on the patterned circuit, and a patterned circuit may be further formed on the interlayer insulation film.

In the production of a printed board, a solder resist may be laminated on the patterned circuit.

In the production of a printed board, a cover lay film may be laminated. The cover lay film typically comprises a substrate film and an adhesive layer formed on a surface of the substrate film, and a surface of the adhesive layer is bonded to a printed board.

A board obtained by etching the copper layer of the copper-clad laminate may be used as an inner circuit board to produce a buildup board.

A printed board to be obtained by the method for producing a printed board of the present invention may be used for various electric appliances and systems. Particularly, the printed board is useful as a board for electronics required to have high frequency properties such as a radar, a router for a network, a backplane or wireless infrastructure, a board for various sensors for automobiles or a board for an engine management sensor, and suitable in applications for reducing transmission loss in millimeter wave ranges.

EXAMPLES

Now, the present invention will be described with reference to Examples, but the present invention is not limited by the following description.

The measuring or test methods employed in each Ex. and materials will be described below.

Measuring Method

<MFR [G/10 Min]>

The mass (g) of a fluororesin discharged from a nozzle having a diameter of 2 mm and a length of 8 mm for 10 minutes at 372° C. under a load of 49N was measured by means of a melt indexer (manufactured by TECHNOL SEVEN CO., LTD.).

<Thickness>

The thickness was obtained by means of a contact type thickness meter OG-525H (manufactured by ONO SOKKI Co., Ltd.) with a gauge head AA-026 ($\varphi$10 mm SR7).

<Dimensional Change Rate [%]>

A sample was prepared by cutting a film into a length (MD) 12 cm×width (TD) 12 cm, and the dimensional change rate was obtained by the following method.

A straight line having a length of about 10 cm was drawn on the sample along each direction of MD and TD at 25° C., and the distance between terminal points of each liner was taken as initial length $L_0$. Then, the sample was subjected to heat treatment at 150° C. for 30 minutes and cooled to 25° C., and the straight line distance $L_1$ between the terminal points of the straight line drawn on the sample was measured to obtain a dimensional change rate (%) by the following formula 1.

$$\text{Dimensional change rate (\%)} = (L_1/L_0 - 1) \times 100 \quad \text{formula 1}$$

The dimensional change rate obtained with respect to the straight line along MD is taken as the dimensional change rate of MD (change rate MD), in terms of an absolute value, and the dimensional change rate obtained with respect to the straight line along TD is taken as the dimensional change rate of TD (change rate TD), in terms of an absolute value.

<Peeling Test>

A produced copper layer laminate was cut into a width of 1 cm to prepare an evaluation sample. The dielectric film and the copper foil were separated from one end in the length direction of the evaluation sample to a position of 50 mm. Then, they were peeled by means of a tensile tester at room temperature at a pulling rate of 100 mm/min at 90°, and the average load from a measuring distance of 20 mm to 80 mm was taken as a peel strength (N/cm). The room temperature was 25° C.

<Electrolytic Corrosion Test>

The electrolytic corrosion test was carried out in accordance with a simplified electrolytic corrosion evaluation method described in "High Insulation Reliability of Glass Cloth Based Copper Clad Laminates", Circuit Technology Vol. 3, No. 4, p 212-219 (1988).

Figure 6:
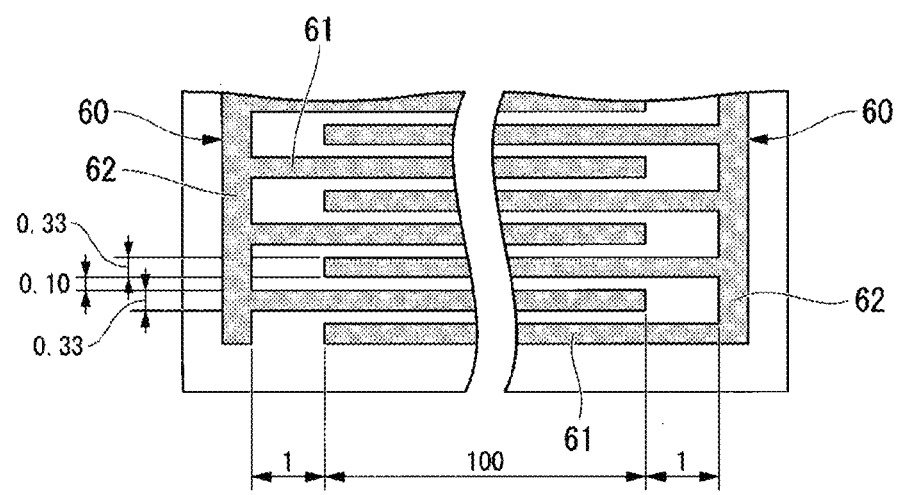
FIG. 6 is a view explaining a pattern used in the electrolytic corrosion test.

In the electrolytic corrosion test, a pattern having two comb patterns 60 in combination illustrated in FIG. 6 is used. Each comb pattern 60 has a plurality of line parts 61 arranged in parallel and a base part 62 extending in a direction orthogonal to the length direction of the line parts 61 and connecting to the respective line parts 61. In the above pattern, a plurality of line parts 61 of one comb pattern 60 and a plurality of line parts 61 of the other comb pattern 60 are alternatively arranged in a direction orthogonal to the length direction of the line parts 61, and the respective comb patterns 60 are not in contact with each other. In each comb pattern 60, the length of the line parts 61 is 100 mm, the width of the line parts 61 is 0.33 mm, and the number of the line parts 61 is 100. The interval between adjacent line parts 61 is 0.10 mm.

A copper layer of a produced copper-clad laminate was etched to form two comb patterns illustrated in FIG. 6 and retained by means of a universal thermo-hygrostat oven (PL-1KTH, manufactured by TABAIESPEC) under a constant temperature and humidity condition of 85° C. and 85% RH for a treatment time of 500 hours to obtain a sample 71.

Figure 7:
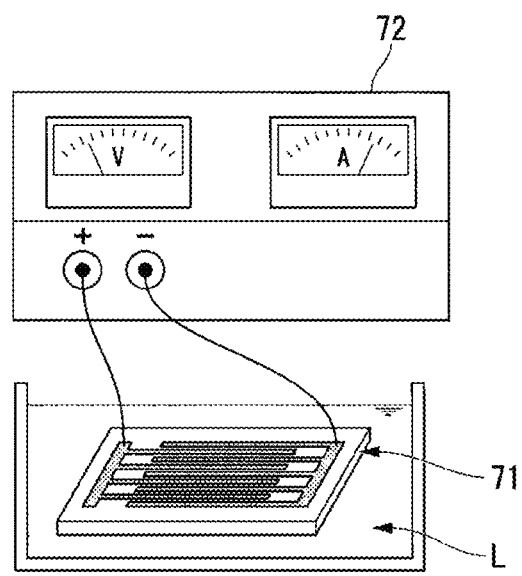
FIG. 7 is a view explaining the method of the electrolytic corrosion test.

As illustrated in FIG. 7, the two comb patterns of the sample 71 were connected to a positive terminal and a negative terminal of a power source 72 respectively, and the sample 71 was dipped in an electrolyte L (1 μmol/L HCl aqueous solution), and voltage was applied. Applied current was 20 VDC, and application time was 100 minutes. Then, the sample 71 was taken out from the electrolyte L, and AC resistance value (Ω·cm) between the two comb patterns was measured under conditions of 10 Hz and 1 A.

The stability in the electrolytic corrosion test was evaluated from the measured AC resistance value based on the following standard. If the two comb patterns contact each other due to deformation or the like, the AC resistant value is low. The higher the AC resistant value is, the better the stability in the electrolytic corrosion test is.

○ (good): AC resistant value exceeds $10^{-9}$ Ω·cm.

x (bad): AC resistant value is at most $10^{-9}$ Ω·cm.

<Used Materials>

PFA1: PFA synthesized in the same manner as in WO2016/017801, paragraph [0124] The proportion of the respective units is TFE/NAH/PPVE=97.9/0.1/2.0 mol %. This PFA has a carboxylic acid anhydride group as the functional group i. The content of the carboxylic acid anhydride group is 1,000 per $1\times10^6$ carbon atoms of the main chain, the melting temperature is 300° C., and the melt flow rate is 17.0 g/10 min.

PFA2: "P-63P" manufactured by Asahi Glass Company, Limited, which is PFA (MFR: 15.0 g/10 min) having no functional group i.

PFA3: "P-62XP" manufactured by Asahi Glass Company, Limited, which is PFA (MFR: 25.0 g/10 min) having no functional group i.

ETFE1: "C88AX" manufactured by Asahi Glass Company, Limited, which is ETFE (MFR: 15 g/10 min) having no functional group i.

Copper foil: "CF-T4X-SVR" manufactured by Fukuda Metal Foil & Powder Co., Ltd., electrolytic copper foil, thickness 12 μm.

Ex. 1

Pellets of PFA1 were extruded into a film form by means of a 65 mmφ single screw extruder (manufactured by Toshiba Machine Co., Ltd., L/D=25, compression ratio of 3.1) having a T die having a width of 700 mm at a forming temperature of 340° C. at a forming rate of 3.5 m/min to obtain a film (untreated film wound in a roll form) having a thickness of 50 μm and a width of 510 mm.

The film was unwound from an unwinding roll 301 by means of an annealing treatment apparatus 300 having the construction illustrated in FIG. 3, conveyed to a heating portion 302 with a tension of 5 N/m, heated at the heating portion 302 under conditions of 150° C. and 5 minutes and wound on a winding roll 304 with a tension of 62.5 N/m to obtain a roll film having a thickness of 50 μm. That is, the annealing treatment conditions were the temperature of 150° C., time of 5 minutes and conveyance tension of 5 N/m, and the winding condition was winding tension of 62.5 N/m.

The obtained roll film was unwound and cut into a length of 15 cm×width of 15 cm, and a copper foil having the same size was placed on one surface, followed by hot press by means of a vacuum pressing machine under conditions of 340° C., 15 minutes and 1.5 MPa to obtain a copper-clad laminate.

The obtained copper-clad laminate was subjected to the peeling test and the electrolytic corrosion test. The results are shown in Table 1.

Ex. 2 to 14

A roll film was obtained in the same manner as in Ex. 1, except that the type of the fluororesin, the forming conditions, the annealing treatment conditions by roll-to-roll process and the winding conditions were changed as shown in Table 1, and a copper-clad laminate was produced and subjected to the peeling test and electrolytic corrosion test. The results are shown in Table 1.

TABLE 1

|  |  | Ex. 1 | Ex. 2 | Ex. 3 | Ex. 4 | Ex. 5 | Ex. 6 | Ex. 7 |
|---|---|---|---|---|---|---|---|---|
| Type of fluororesin |  | PFA1 | PFA1 | PFA1 | PFA1 | PFA1 | PFA1 | PFA1 |
| Molding condition |  |  |  |  |  |  |  |  |
| Die width | [mm] | 700 | 700 | 1,900 | 1,900 | 1,900 | 1,900 | 1,900 |
| Forming rate | [m/min] | 3.5 | 3.5 | 10 | 10 | 10 | 10 | 10 |
| Annealing treatment conditions |  |  |  |  |  |  |  |  |
| Temperature | [° C.] | 150 | 150 | 150 | 150 | 150 | 150 | 240 |
| Time | [min] | 5 | 5 | 5 | 15 | 5 | 5 | 5 |
| Tension | [N/m] | 5 | 10 | 5 | 10 | 5 | 5 | 5 |
| Winding conditions | [N/m] |  |  |  |  |  |  |  |
| Tension | [N/m] | 62.5 | 125 | 62.5 | 62.5 | 31.3 | 300 | 62.5 |
| Roll film physical properties |  |  |  |  |  |  |  |  |
| Construction |  | Monolayer film | Monolayer film | Monolayer film | Monolayer film | Monolayer film | Monolayer film | Monolayer film |
| Thickness | [μm] | 50 | 50 | 50 | 25 | 12 | 25 | 25 |
| Width | [mm] | 510 | 510 | 1,500 | 1,500 | 1,500 | 1,500 | 1,500 |

TABLE 1-continued

|  |  |  |  |  |  |  |  |
|---|---|---|---|---|---|---|---|
| Change rate MD | [%] | 0.05 | 0.1 | 0.05 | 0.19 | 0.11 | 0.91 | 0.5 |
| Change rate TD | [%] | 0.02 | 0.04 | 0.02 | 0.08 | 0.04 | 0.81 | 0.4 |
| Winding tension/change rate MD |  | 1,250 | 1,250 | 1,250 | 625 | 310 | 625 | 625 |
| Copper-clad laminate |  |  |  |  |  |  |  |  |
| Peeling strength | [N/m] | 17 | 16.9 | 17 | 18.6 | 17.5 | 18.1 | 17.1 |
| AC resistance value | [$10^{-9}$ Ω·cm] | 8.7 | 8.8 | 8.7 | 9.2 | 8.7 | 8.7 | 9.0 |
| Evaluation |  | ○ | ○ | ○ | ○ | ○ | ○ | ○ |

|  |  | Ex. 8 | Ex. 9 | Ex. 10 | Ex. 11 | Ex. 12 | Ex. 13 | Ex. 14 |
|---|---|---|---|---|---|---|---|---|
| Type of fluororesin |  | PFA1 | PFA1 | PFA1 (10) PFA2 (90) | PFA1 (10) PFA3 (90) | PFA1 | PFA1 (20) PFA2 (90) | PFA1 (10) PFA2 (90) |
| Molding condition |  |  |  |  |  |  |  |  |
| Die width | [mm] | 1,900 | 1,900 | 1,900 | 1,900 | 1,900 | 1,900 | 1,900 |
| Forming rate | [m/min] | 10 | 10 | 10 | 10 | 10 | 10 | 10 |
| Annealing treatment conditions |  |  |  |  |  |  |  |  |
| Temperature | [° C.] | 90 | 150 | 150 | 150 | Not carried out | Not carried out | Not carried out |
| Time | [min] | 5 | 5 | 15 | 15 |  |  |  |
| Tension | [N/m] | 5 | 5 | 5 | 5 |  |  |  |
| Winding conditions | [N/m] |  |  |  |  |  |  |  |
| Tension | [N/m] | 62.5 | 650 | 50 | 37.5 | 37.5 | 37.5 | 37.5 |
| Roll film physical properties |  |  |  |  |  |  |  |  |
| Construction |  | Monolayer film | Monolayer film | Monolayer film | Monolayer film | Monolayer film | Monolayer film | Monolayer film |
| Thickness | [μm] | 25 | 50 | 50 | 50 | 50 | 50 | 50 |
| Width | [mm] | 1,500 | 1,500 | 1,500 | 1,500 | 1,500 | 1,500 | 1,500 |
| Change rate MD | [%] | 0.99 | 1.0 | 0.04 | 0.03 | 1.2 | 1.7 | 1.3 |
| Change rate TD | [%] | 0.75 | 0.94 | 0.02 | 0.02 | 0.88 | 1.1 | 0.72 |
| Winding tension/change rate MD |  | 625 | 1,250 | 1,250 | 1,250 | 31 | 22 | 29 |
| Copper-clad laminate |  |  |  |  |  |  |  |  |
| Peeling strength | [N/m] | 18.3 | 17.9 | 16.9 | 17.7 | 16.5 | 1.7 | 17.1 |
| AC resistance value | [$10^{-9}$ Ω·cm] | 8.7 | 0.1 | 25 | 18 | 0.69 | 0.84 | 0.67 |
| Evaluation |  | ○ | X | ○ | ○ | X | X | X |

In Table 1, the expression of "PFA1 (10), PFA2 (90)" in Ex. 10 means that PFA1 and PFA2 were used in combination respectively in proportions of 10 mass % and 90 mass %. Other expressions in other Ex. and other Tables are used in the same manner.

Ex. 15

PFA1 was extruded into a film form by means of a 65 mmφ single screw extruder (manufactured by Toshiba Machine Co., Ltd., L/D=25, compression ratio of 3.1) having a T die having a width of 1,900 mm at a forming temperature of 340° C. at a forming rate of 20 m/min to obtain a film having a thickness of 25 μm and a width of 1,500 mm.

The film was subjected to annealing treatment by means of a bonding apparatus 200 having the construction illustrated in FIG. 2 and an annealing treatment apparatus 300 having the construction illustrated in FIG. 3 by the following procedure and wound to obtain a roll film having the film and a substrate laminated via an adhesive layer.

First, an untreated film 12 was conveyed from a first unwinding roll 201 to bonding rolls 203 and 204 in the bonding apparatus 200, a substrate 13 having an adhesive layer was conveyed from a second unwinding roll 202 to the bonding rolls 203 and 204, and the untreated film 12 and the substrate 13 having an adhesive layer were bonded by the bonding rolls 203 and 204 at room temperature, and the obtained laminate 14 was wound on a winding roll 205.

As the substrate for the substrate 13 having an adhesive layer, a film having a thickness of 50 μm obtained by extruding pellets of PFA2 in the above-mentioned manner was used. The adhesive layer was formed of a urethane acrylate adhesive into a thickness of 2 μm.

Next, the wound laminate 14 was transferred to an unwinding roll 301 in the annealing treatment apparatus 300, unwound from the unwinding roll 301, conveyed to a heating portion 302 with a tension of 5 N/m, heated at the heating portion 302 under conditions of 150° C. and 5 minutes and wound on a winding roll 304 with a tension of at most 100 N/m to obtain a roll film. That is, the annealing treatment conditions were the temperature of 150° C., time of 5 minutes and conveyance tension of 5 N/m, and the winding condition was winding tension of at most 100 N/m.

The obtained roll film was unwound and cut into a length of 15 cm×width of 15 cm, a copper foil having the same size was placed on a surface of the roll film side (surface of PFA1 side), and the substrate having an adhesive layer was peeled, followed by hot press by means of a vacuum pressing machine under conditions of 340° C., 15 minutes and 1.5 MPa to obtain a copper-clad laminate.

The obtained copper-clad laminate was subjected to the peeling test and the electrolytic corrosion test. The results are shown in Table 2.

Ex. 16 to 21

A roll film was obtained in the same manner as in Ex. 1, 5 except that the type of the fluororesin, the substrate and the annealing treatment conditions (temperature, time and conveyance tension) by roll-to-roll process were changed as shown in Table 2, and a copper-clad laminate was produced and subjected to the peeling test and the electrolytic corrosion test. The results are shown in Table 2.

TABLE 2

| Type of fluororesin | | Ex. 15 PFA1 | Ex. 16 PFA1 | Ex. 17 PFA1 | Ex. 18 PFA1 | Ex. 19 PFA1 | Ex. 20 PFA1 | Ex. 21 PFA1 |
|---|---|---|---|---|---|---|---|---|
| Annealing treatment conditions | | | | | | | | |
| Temperature | [° C.] | 150 | 150 | 150 | 150 | Not carried out | Not carried out | Not carried out |
| Time | [min] | 5 | 5 | 5 | 5 | | | |
| Tension | [N/m] | 5 | 10 | 5 | 5 | | | |
| Roll film physical properties | | | | | | | | |
| Construction | | With substrate | With substrate | With substrate | With substrate | With substrate | With substrate | With substrate |
| Thickness | [μm] | 25 | 25 | 12 | 6 | 25 | 12 | 6 |
| Width | [mm] | 1,500 | 1,500 | 1,500 | 1,500 | 1,500 | 1,500 | 1,500 |
| Change rate MD | [%] | 0.04 | 0.08 | 0.08 | 0.1 | 1.8 | 2.5 | 4.5 |
| Change rate TD | [%] | 0.02 | 0.04 | 0.04 | 0.08 | 1.0 | 1.8 | 2.8 |
| Copper-clad laminate | | | | | | | | |
| Peeling strength | [N/m] | 16.5 | 16.4 | 15.2 | 15.2 | 16.3 | 15.1 | 14.2 |
| AC resistance value | [$10^{-9}$ Ω · cm] | 8.9 | 8.8 | 5.4 | 5.4 | 0.7 | 0.3 | 0.1 |
| Evaluation | | ○ | ○ | ○ | ○ | X | X | x |

In Table 2, as the substrates 13 in Ex. 18 and 19, a film made of PFA2 and having a thickness of 75 μm was used, instead of the film made of PFA2 having a thickness of 50 μm.

Ex. 22

A co-extruded film having a two-layer structure was prepared by the following procedure. PFA1 was melted at a preset temperature of 340° C. and supplied to a first manifold of a 400 m width two-layer multi manifold die by means of a 15 mmφ single screw extruder (manufactured by Tanabe Plastics Machinery Co., Ltd.), ETFE1 was melted at a preset temperature of 340° C. and supplied to a second manifold by means of a 30 mmφ single-screw extruder (manufactured by IKEGAI Corp.), and the respective molten resins were extruded into a film form from the multi manifold die at a forming rate of 2 m/min to obtain a co-extruded film having a first layer (PFA1) having a thickness of 25 μm and a second layer (ETFE1) having a thickness of 75 μm and having a width of 320 mm. The co-extruded film was subjected to annealing treatment and wound in the same manner as in Ex. 1 to obtain a roll film. The change rate MD of the roll film was 0.03, and the change rate TD was 0.02. The peeling strength of a copper-clad laminate obtained by using the roll film was 8.4 N/m, the AC resistance value was 8.4×$10^{-9}$ Ω·cm, and evaluation was "○".

INDUSTRIAL APPLICABILITY

A highly reliable printed board which is suitable for high frequency devices can be obtained by using the roll film of the present invention.

This application is a continuation of PCT Application No. PCT/JP2019/016355, filed on Apr. 16, 2019, which is based upon and claims the benefit of priority from Japanese Patent Application No. 2018-081794 filed on Apr. 20, 2018. The contents of those applications are incorporated herein by reference in their entireties.

REFERENCE SYMBOLS

11: melt, 12: untreated film, 13: substrate having an adhesive layer, 14 and 15: laminate, 40 and 50: copper-clad laminate, 41 and 51: dielectric layer, 42: copper layer, 52: first copper layer, 53: second copper layer, 60: comb pattern, 61: line part, 62: base part, 71: sample, 72: power source, L: electrolyte, 100: production apparatus of untreated film, 101: extruder, 102: T-die, 103: quenching roll, 104: cooling roll, 105: nip roll, 106: winding roll, 200: bonding apparatus, 201: first unwinding roll, 202: second unwinding roll, 203 and 204: bonding roll, 205: winding roll

What is claimed is:

1. A method for producing a roll film, the method comprising:
    subjecting a film comprising a melt-processable fluororesin as the main component and having a thickness of from 1 to 100 μm to annealing treatment at from a temperature lower by 210° C. than the melting temperature (Tm) of the melt-processable fluororesin to a temperature lower by 20° C. than Tm and then winding the film,
    wherein the roll film comprises a melt-processable fluororesin as the main component, has a thickness of from 1 to 100 μm, and has a dimensional change rate of less than 1.0%, in terms of an absolute value, in each of MD and TD, when heated at 150° C. for 30 minutes and then cooled to 25° C., based on the dimension at 25° C., and
    wherein the annealing treatment is carried out with a tension of from 1 to 10 N/m applied to the film.

2. The method of claim 1, wherein the annealing treatment is carried out with a tension of 1 to 5 N/m applied to the film.

3. The method of claim 1, wherein the film is wound with a tension of at most 500 N/m applied on the film.

4. A method for producing a copper-clad laminate, the method comprising producing a roll film using the method of claim 1;
    unwinding the roll film to produce an unwound film; and
    forming a copper layer on a surface of the unwound film.

5. The method of claim 4, which forms a copper layer having an AC resistance value of higher than 1.0×$10^{-9}$ Ω·cm.

6. A method for producing a printed board, the method comprising
   producing a copper-clad laminate by the method of claim 4 and
   etching the copper layer to form a patterned circuit.

* * * * *